United States Patent [19]

Cotney

[11] Patent Number: 5,035,034
[45] Date of Patent: Jul. 30, 1991

[54] HOLD-DOWN CLAMP WITH MULT-FINGERED INTERCHANGEABLE INSERT FOR WIRE BONDING SEMICONDUCTOR LEAD FRAMES

[75] Inventor: Garland D. Cotney, Tempe, Ariz.
[73] Assignee: Motorola, Inc., Schaumburg, Ill.
[21] Appl. No.: 553,015
[22] Filed: Jul. 16, 1990
[51] Int. Cl.[5] ...................... H01L 21/60; H01L 21/68
[52] U.S. Cl. .................................. 29/25.01; 228/4.5; 228/44.7; 228/179
[58] Field of Search ................ 29/25.01; 228/4.5, 179, 228/44.7

[56] References Cited
FOREIGN PATENT DOCUMENTS 62-155526  7/1987  Japan .................................. 228/4.5

Primary Examiner—Olik Chaudhuri
Assistant Examiner—David E. Graybill
Attorney, Agent, or Firm—Joe E. Barbee

[57] ABSTRACT

A multi-fingered clamp assembly provides for the independent clamping of individual leads of a semiconductor device lead frame during wire bonding. The assembly consists of a clamp frame which carries and supports an interchangeable clamp insert. The clamp insert provides individual spring-like fingers which align directly with the leads to be clamped, clamping each lead independently and uniformly. This results in better, more uniform mechanical integrity of the bond. The clamp frame is aligned to the wire bond equipment, allowing a new clamp insert to be inserted for a different application without necessitating realignment.

9 Claims, 3 Drawing Sheets

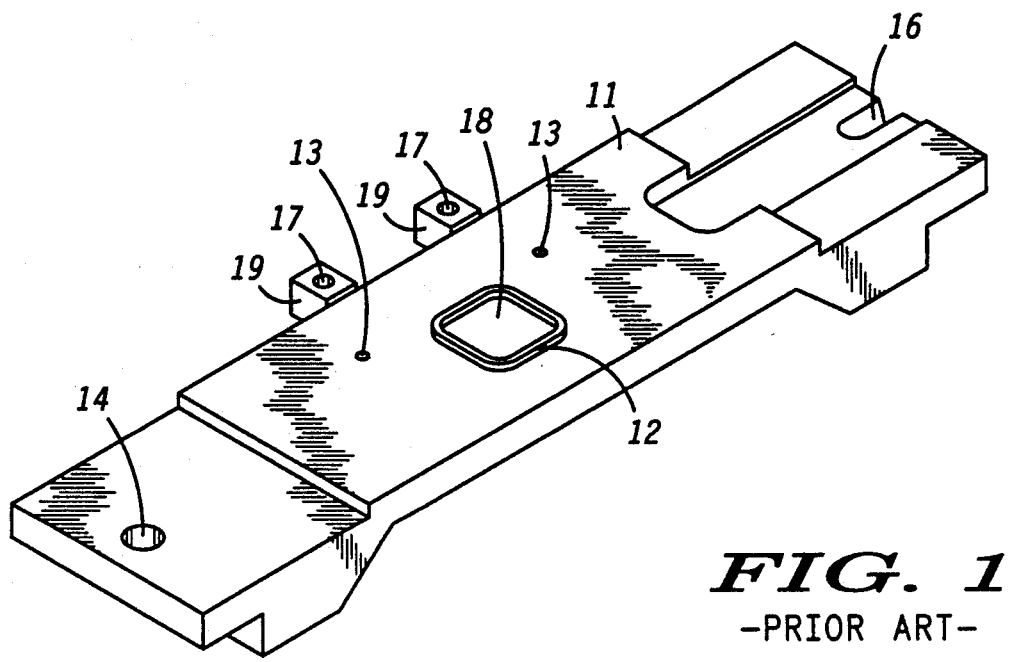
FIG. 1
—PRIOR ART—
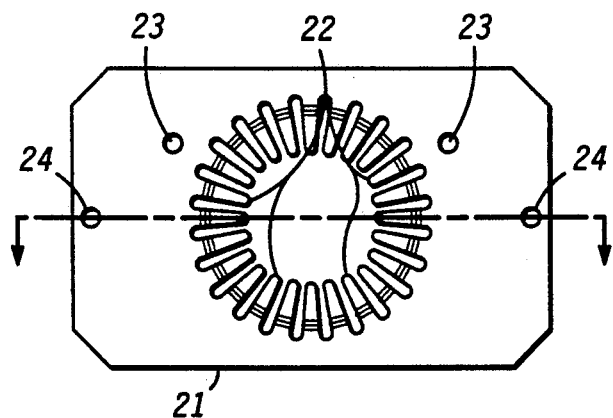
FIG. 2
FIG. 3
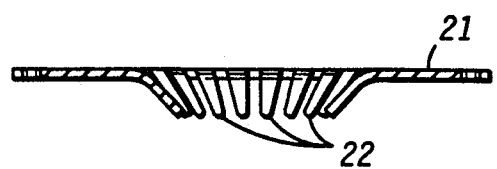

HOLD-DOWN CLAMP WITH MULT-FINGERED INTERCHANGEABLE INSERT FOR WIRE BONDING SEMICONDUCTOR LEAD FRAMES

BACKGROUND OF THE INVENTION

The present invention relates, in general, to work holding devices, and more particularly to a device for holding the leads of a semiconductor device lead frame during wire bond operations wherein the leads of the lead frame are electrically connected to the bonding pads of a semiconductor device by bond wires.

One common method of packaging semiconductor devices is to attach the device to a metallic lead frame, electrically connect the device to the leads of the lead frame with bond wires, and then encapsulate the resulting assembly in a molded plastic body. The lead frame generally consists of a rectangular pad, or flag, to which the semiconductor device is attached, normally by either a form of solder or a form of epoxy. The flag is surrounded by a number of leads which are electrically isolated from the flag. The leads extend outward radially from the flag, and are joined together in a supporting structure that forms the lead frame. The semiconductor device has small electrical contacts about the periphery of the device which are bonded via filament wires to the leads of the lead frame, providing for electrical access to the device. The operation wherein the bonding pads are connected to the lead frame leads, called wire bond, normally consists of ultrasonically scrubbing a wire, with a diameter in the range of 25 to 125 microns, against the point to which the wire is to be bonded. The metal of the wire alloys with the metal of the bond point, forming a good electrical and mechanical connection. Since the leads are not mechanically supported on the ends to which the bond wire is attached, it is necessary during this wire bond operation to clamp the leads so that good electro-mechanical contact is achieved.

In the traditional lead frame, the flag was integrally connected to the lead frame. As circuit complexity increased, so did power dissipation of the device. It became necessary to increase the size of the flag so as to act as a more efficient heat sink for the device. As the flag was made larger, the length of the bond wires increased, becoming a limiting factor as to how large the flag could be made. It became necessary, for certain applications, to make the flag larger than was possible in the traditional configuration. Accordingly, an approach was developed wherein the lead frame was made without an integral flag. A large flag was then attached to the leads of the lead frame by means of non-conductive tape. The die was then attached to the flag, and the entire assembly processed through wire bond.

To form a good alloy during wire bond, it is necessary to perform the ultrasonic bonding at an elevated temperature. Therefore, the lead frame assembly with attached flag and semiconductor device was placed on a heater block and heated to the appropriate temperature. The leads were then clamped in the traditional manner. The problem was that the leads were not held between the clamp and the heater block as with the traditional lead frame configuration. Rather, the leads were held between the clamp and the attached flag, which rested upon the heater block. The tape cementing the flag to the leads became soft at the elevated temperature. The leads could then move in response to the ultrasonic energy, thus absorbing the ultrasonic energy. As a result, the mechanical integrity of the bond was reduced. Since the various leads could be of somewhat different thicknesses, the force of the clamp was different from one lead to the next, further allowing some leads to move while others were clamped effectively. If more pressure were used in order to clamp the leads more tightly, certain leads would be clamped too tightly. This would cause them to deform, and delaminate from the flag to which they were taped.

Another characteristic of the traditional wire bond lead clamps was that for different sized lead frames, different sized clamps were necessary. Thus, if the device that the wire bond machine was set up to work on was to be changed, it was necessary to remove the clamp, replace it with the appropriate new clamp, and realign the system. This could be a time consuming project, interrupting the efficient flow of work through the wire bond station.

SUMMARY OF THE INVENTION

The objects and advantages of the present invention are to provide an improved apparatus for clamping the leads of a semiconductor device lead frame by means of a multi-fingered clamp assembly. The assembly consists of a multi-fingered clamp insert secured in a supporting clamp frame. The assembly rigidly holds the leads of the lead frame against a supporting structure, such as a heater block. The individual fingers of the clamp insert provide an even pressure upon each of the leads of the lead frame, independent of the relative thickness of each lead. This results in more efficient clamping and therefore more uniform wire bond results. The clamp insert is removable from the clamp frame, allowing the clamp insert to be changed without disturbing the alignment of the clamp frame, contributing to increased production throughput.

BRIEF DESCRIPTION OF THE DRAWINGS

FIG. 1 is a bottom side oblique view of a prior art clamp;

FIG. 2 is a top view of an interchangeable clamp insert such as that used in the present invention;

FIG. 3 is a side view of the interchangeable clamp insert of FIG. 2.;

DETAILED DESCRIPTION OF THE DRAWINGS

The discussion of the present invention begins with a review of the prior art. FIG. 1 illustrates a common wire bond lead clamp as seen from a bottom side view. The body of clamp 11 is machined from a single piece of metal. The actual clamping is accomplished by raised ridge 12, which is machined into the center of the bottom side of clamp 11. Ridge 12 fixes the leads of a lead frame against an underlying heater block. Inside the inner diameter of ridge 12, large hole 18 is machined, allowing for clearance for a semiconductor device which is being bonded to the lead frame. The remainder of the details of the structure are for mounting and aligning purposes. Holes 13, located symmetrically on either side of ridge 12 and slightly off center from a center line running the length of clamp 11, provide for the precise alignment of clamp 11 to the heater block. Hole 14, located on one end of clamp 11, accepts a retaining pin for fixing the clamp to a wire bonder. Slot 16, located on the other end of clamp 11, also accepts a retaining pin, but allows for the expansion of the clamp as it is heated due to its proximity to the supporting heater block. Holes 17, located in the center of tabs 19, provide for the precise alignment of the lead frame to clamp 11. Tabs 19 are located on one edge of clamp 11, symmetrically spaced in relationship to hole 18.

As discussed above, the rigid nature of ridge 12 gives rise to the situation where, if some of the leads to be clamped are thicker than others, when the clamp is lowered into position over the lead frame and heater block, ridge 12 will come into contact first with the thickest leads. This means that certain leads will be clamped more tightly than others. Those leads less effectively clamped may be able to move in response to an ultrasonic bonding motion, reducing the mechanical integrity of the bond.

Figure 4:
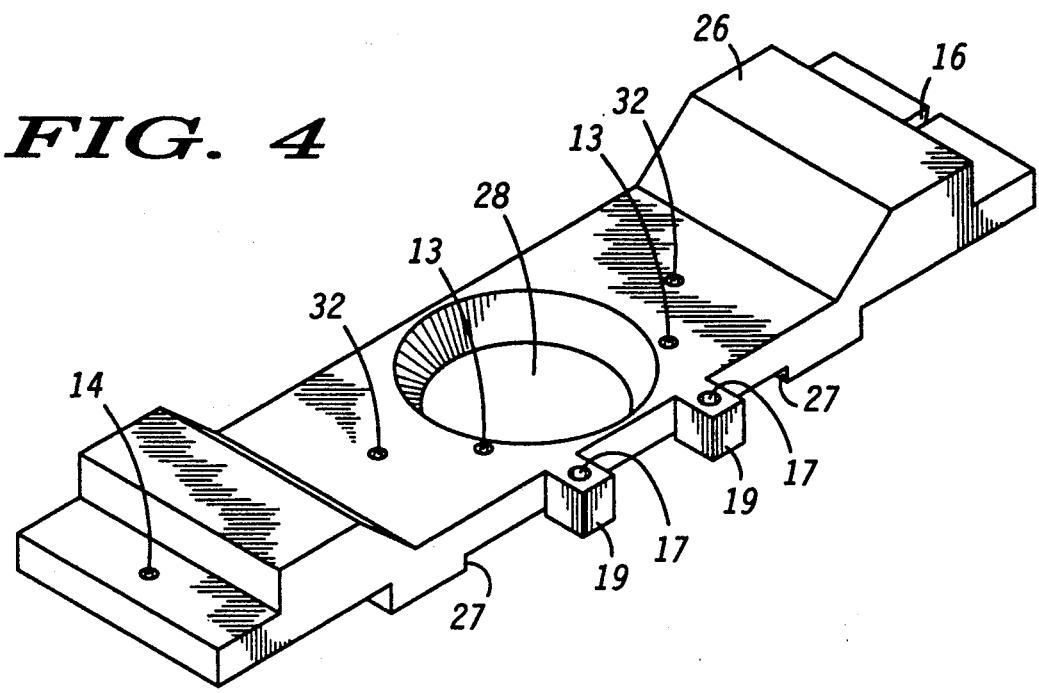
FIG. 4 is a top side oblique view of a clamp frame with provision for attaching the clamp insert of FIG. 2 to the bottom side of the clamp frame.
Figure 5:
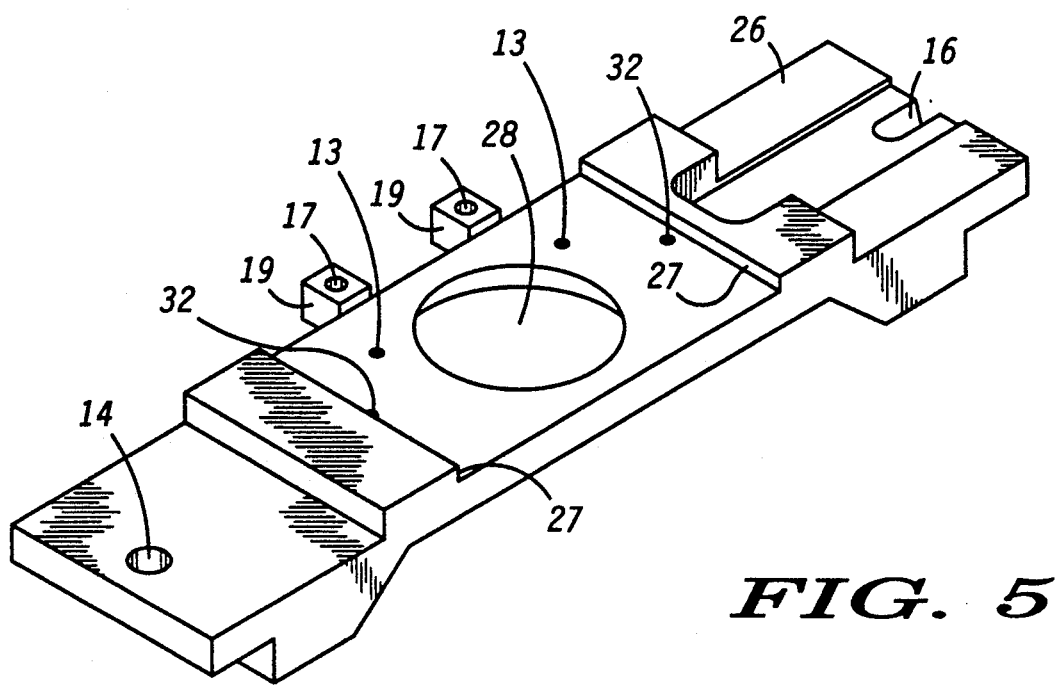
FIG. 5 is a bottom side oblique view of the clamp frame of FIG. 4.
Figure 6:
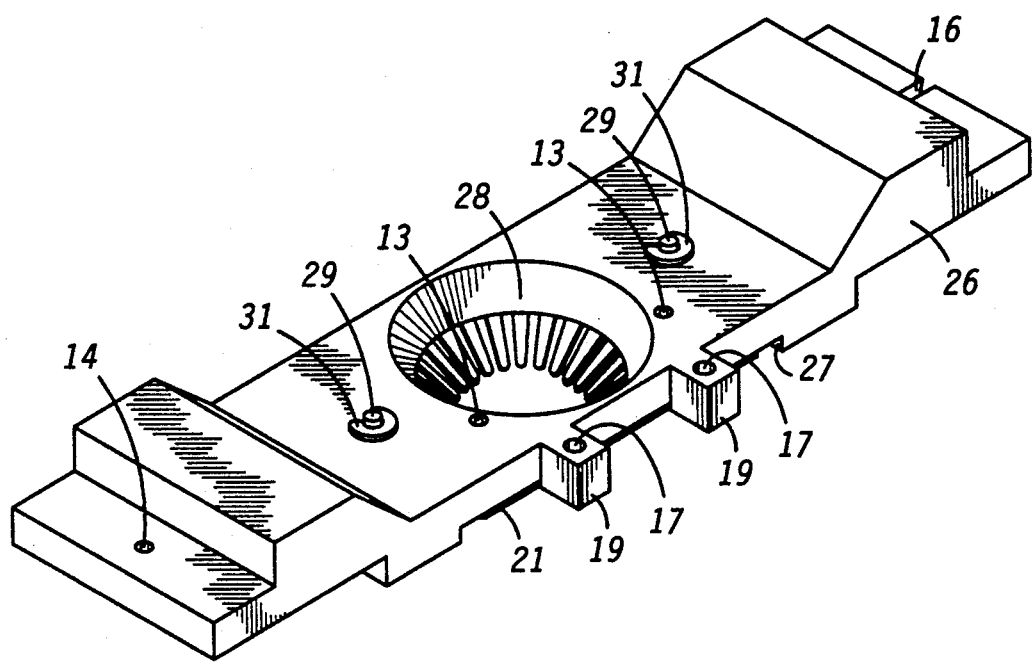
FIG. 6 is a top side oblique view of a clamp assembly having the clamp insert of FIG. 2 attached to the bottom side of the clamp frame of FIG. 4.

The present invention solves this problem by providing a means for clamping each of the various leads of the lead frame independently. The relative thickness of one lead will thus have little or no influence upon the force with which other leads are clamped. FIG. 2 and FIG. 3 illustrate a top and a side view of a multi-fingered replacement for the clamping function of raised ridge 12 of FIG. 1. Clamp insert 21 is made to be attached to a clamp frame such as illustrated in FIGS. 4, 5, and 6. In the preferred embodiment, clamp insert 21 is crafted such that there is one finger 22 for each lead to be clamped. Insert 21 is made from a flexible, preferably metallic, material which allows fingers 22 to be bent downward at an angle typically between thirty degrees and forty five degrees, as illustrated in FIG. 3. In all cases, the angle at which fingers 22 bend must be less than ninety degrees. Fingers 22 then attempt to hold this shape when in position to clamp a lead frame against a supporting structure, causing each finger 22 to hold the lead above which it is aligned with a spring-like force. Holes 24 are made in either end of clamp insert 21, aligning with the longitudinal center line of clamp insert 21. Holes 24 provide for a means for attaching clamp insert 21 to a supporting clamp frame.

Accordingly, clamp insert 21 is attached to clamp frame 26, illustrated in FIG. 4 and FIG. 5. The body of clamp frame 26 supports clamp insert 21 and performs the alignment functions of clamp 11 of FIG. 1. Clamp frame 26 is similar in many respects to clamp 11, directly replacing clamp 11 in the wire bonder. The major differences are the adaptations necessary for clamp frame 26 to accept clamp insert 21. Recess 27 is machined into the bottom side of clamp frame 26 so as to be able to receive clamp insert 21. Holes 32 are added to the clamp frame, precisely aligning with holes 24 in clamp insert 21. Hole 18 of of clamp 11 is replaced by somewhat larger hole 28, through which fingers 22 of clamp insert 21 are visible.

The complete clamp assembly is illustrated in FIG. 6. Clamp insert 21 is attached to clamp frame 26 by insertion into recess 27. Pins 29 are then inserted through holes 24 in the clamp insert and through holes 32 in the clamp frame. The heads of pins 29 are sized so as to act as stops to limit the force with which fingers 22 press down upon the leads of the lead frame. Pins 29 are secured by clips 31. Clamp insert 21 is thus fastened securely to clamp frame 26. The completed assembly is then mounted on the wire bonder. Holes 23 in clamp insert 21 precisely align with holes 13 in clamp frame 26. These holes are used to precisely align the clamp assembly with the heater block.

Different sized lead frames require different sized clamps. The major time consuming activity in changing to a new clamp is the alignment of the clamp to the heater block. Since clamp insert 21 can be changed without removing clamp frame 26 from the wire bonder, the time required to set up the wire bonder for different lead frames is greatly reduced because no realignment is necessary. Further reduction in time required to change clamp insert 21 could be realized by attaching clamp insert 21 to clamp frame 26 from the top. In this configuration, fingers 22 of clamp insert 21 extend through hole 28. Access to clamp insert 21 is increased, further reducing the difficulty of changing clamp insert 21.

By now it should be appreciated that there has been provided an improved means of clamping the leads of a semiconductor device lead frame during wire bonding. The present invention allows individual leads to be clamped independently. This results in a more effective clamping of each lead, which provides for greater and more uniform mechanical integrity for the bond between the lead and the bond wire.

I claim:

1. An apparatus for clamping leads of a semiconductor device lead frame which comprises:
    a multi-fingered clamp insert for fixedly holding the leads of the lead frame against a supporting structure;
    a clamp frame for carrying and aligning the clamp insert, having a top side and a bottom side; and
    means for securing the clamp insert to the clamp frame.

2. An apparatus according to claim 1, wherein the multi-fingered clamp insert comprises an element crafted of planar flexible material such that there exists a hole in the center of the element, the element having a plurality of fingers reaching radially inward toward the center of the hole, the fingers being uniformly bent out of the major plane of the material at an angle of less than ninety degrees.

3. An apparatus according to claim 2, wherein the clamp insert has one finger for each lead of the lead frame to be clamped, each finger clamping one lead, the fingers of the clamp insert directly aligning with the leads to be clamped.

4. An apparatus according to claim 2, wherein the clamp insert has less than one finger for each lead of the lead frame to be clamped, each finger clamping more than one lead.

5. An apparatus according to claim 2 wherein the clamp frame comprises:
    a rigid structure having a bottom side and a top side, with provision for mounting to a bonder used for wire bonding semiconductor devices;
    a recess in the bottom side of the structure, into which the clamp insert is inserted;
    a large hole machined through the center of the structure through which the fingers of the clamp insert are visible; and
    at least one small hole drilled through the structure.

6. An apparatus according to claim 5, wherein the means for securing the clamp insert to the clamp frame comprises:
- at least one small hole drilled through the clamp insert which precisely aligns with the small hole drilled through the clamp frame;
- at least one pin, having a long, narrow end which fits tightly in the small holes, and having a short, broad end which prevents the pin from passing completely through the small hole, the pin being inserted into the small holes drilled through the clamp insert and the clamp frame in such a manner as to hold the clamp insert securely in the recess in the bottom side of the clamp frame; and
- at least one fastener, which fastens to the pin in such a manner as to hold the pin securely in the small holes.

7. An apparatus for clamping the leads of a lead frame during a wire bond operation which comprises:
- a multi-fingered clamp insert for fixedly holding the leads of the lead frame against a supporting structure, the fingers being spring loaded, each finger clamping at least one lead in place; and
- means for carrying and aligning the clamp insert.

8. An apparatus for fixedly holding leads of a semiconductor lead frame during wire bonding, comprising:
- a clamp insert having a plurality of individually spring loaded fingers; and
- support means for receiving the semiconductor lead frame and against which the plurality of fingers hold the leads of the lead frame.

9. A method for clamping the leads of a semiconductor lead frame during a wire bond operation comprising:
- mounting a multi-finger clamp insert onto a clamp frame;
- aligning the clamp insert over the leads of the lead frame; and
- pressing down upon the leads of the lead frame with the clamp insert in such a manner that each finger of the clamp insert securely holds at least one of the leads against a supporting structure.

* * * * *